United States Patent
Gowni et al.

[11] Patent Number: 5,534,806
[45] Date of Patent: Jul. 9, 1996

[54] PULL-DOWN ACCESS FOR AN OUTPUT BUFFER

[75] Inventors: Shiva P. Gowni, New Delhi, Ind.; Allen R. White, Starkville, Miss.

[73] Assignee: Cypress Semiconductor Corp., San Jose, Calif.

[21] Appl. No.: 318,137

[22] Filed: Oct. 5, 1994

[51] Int. Cl.⁶ .............................. H03K 5/12; H03K 17/04
[52] U.S. Cl. .................... 327/170; 327/377; 327/407; 327/333
[58] Field of Search ......................... 327/170, 377, 327/408, 261, 267, 407, 333

[56] References Cited

U.S. PATENT DOCUMENTS

| | | | |
|---|---|---|---|
| 5,315,172 | 5/1994 | Reddy | 327/170 |
| 5,329,175 | 7/1994 | Peterson | 327/170 |
| 5,410,262 | 4/1995 | Kang | 327/170 |

FOREIGN PATENT DOCUMENTS 4051712  2/1992  Japan ......................... 327/170

*Primary Examiner*—Margaret Rose Wambach
*Attorney, Agent, or Firm*—Blakely, Sokoloff, Taylor & Zafman

[57] ABSTRACT

A pull-down output device controls the discharge of an output signal for a pull-down transition. A pull-down control signal is generated in response to an input signal. A control signal is generated in response to the pull-down control signal to couple a first voltage terminal to a control signal node. The output signal is initially discharged as a bipolar transistor is turned-on by the control signal at the node and couples the output signal to a second voltage terminal. The first voltage terminal is decoupled from the control signal node as a control signal is generated to couple the output signal to the control signal node. The output signal is further discharged through the bipolar transistor. The discharge of the output signal is thus controlled.

12 Claims, 5 Drawing Sheets

5,534,806

PULL-DOWN ACCESS FOR AN OUTPUT BUFFER

RELATED APPLICATIONS

The present patent application is related to U.S. patent application Ser. No. 08/318,146 by Allen R. White and Shiva P. Gowni, entitled "OUTPUT ENABLE ACCESS FOR AN OUTPUT BUFFER," filed on the same filing date as the present patent application, and assigned to the assignee of the present patent application.

BACKGROUND OF THE INVENTION

1. Field of the Invention

The present invention relates generally to the field of electrical devices. More particularly, the present invention relates to the field of output buffers.

2. Description of the Related Art

With increased use and complexity of digital data processing systems, the speed at which digital data processing systems are able to perform various tasks has become more and more important.

One type of digital device that may limit the performance of digital data processing systems is output buffers. Output buffers are typically employed in digital data processing systems to drive addresses, data, or control signals, for example, over bus lines that couple various digital components, such as microprocessors, various storage or memory devices, controllers, etc.

For each bit to be outputted over the bus lines, a typical output buffer uses pull-up circuitry or pull-down circuitry to drive either a logical-one or high signal or a logical-zero or low signal, respectively, over a bus line depending upon the state of the bit to be outputted. Many times the output buffer undergoes various transitions in driving bits over the bus lines.

For example, the output buffer may undergo selected-to-deselected and deselected-to-selected transitions as the output buffer is used in driving bits over the bus lines. For example, the output buffer may first be in a deselected state as the output buffer is not being used to drive any bits over a bus line. In the deselected state, the output buffer is electrically isolated from the bus line to avoid interfering with other output buffers that may be driving data over the same bus line, for example. When the output buffer is selected for driving signals over the bus line, the output buffer undergoes a deselected-to-selected transition to electrically couple the output buffer to the bus line in driving signals over the bus line.

The output buffer may also undergo high-to-low and low-to-high transitions in driving bits over the bus lines. For example, the output buffer may first output a logical-one or high signal over a bit line and then output a logical-zero or low signal over the same bit line. The output buffer undergoes a high-to-low transition in order to output the subsequent low signal.

Because of the various transitions the output buffer endures in outputting bits, the output of each bit onto a bus line is delayed. As a result of such delays, the performance of digital data processing systems becomes limited.

SUMMARY AND OBJECTS OF THE INVENTION

One of the objects of the present invention is to provide for relatively speedier signal transitions.

Another object of the present invention is to provide for relatively less delay in driving bits over a signal line.

Another object of the present invention is to provide for relatively less delay for the pull-down access for an output buffer.

A method for controlling a discharge of an output signal is described. An input signal is received. A first control signal is generated in response to the input signal. A second control signal is generated in response to the first control signal. The output signal is initially discharged in response to the second control signal. The second control signal is controlled in response to the first control signal such that the discharge of the output signal is controlled.

An electrical apparatus for controlling a discharge of an output signal is also described. The electrical apparatus includes first circuitry, response to an input signal, for generating a first control signal and second circuitry, responsive to the first control signal, for generating a second control signal. The electrical apparatus also includes third circuitry, responsive to the second control signal, for initially discharging the output signal and fourth circuitry, responsive to the first control signal, for controlling the second control signal such that the discharge of the output signal is controlled.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for pull-down access for an output buffer. In the following description, details are set forth such as specific circuit elements, device sizes, etc., in order to provide a thorough understanding of the present invention. It will be evident, however, that the present invention may be practiced without these details. In other instances, the operation of known devices and circuitry, specific parameters, etc., have not been described in particular detail so as not to obscure the present invention.

Figure 1:
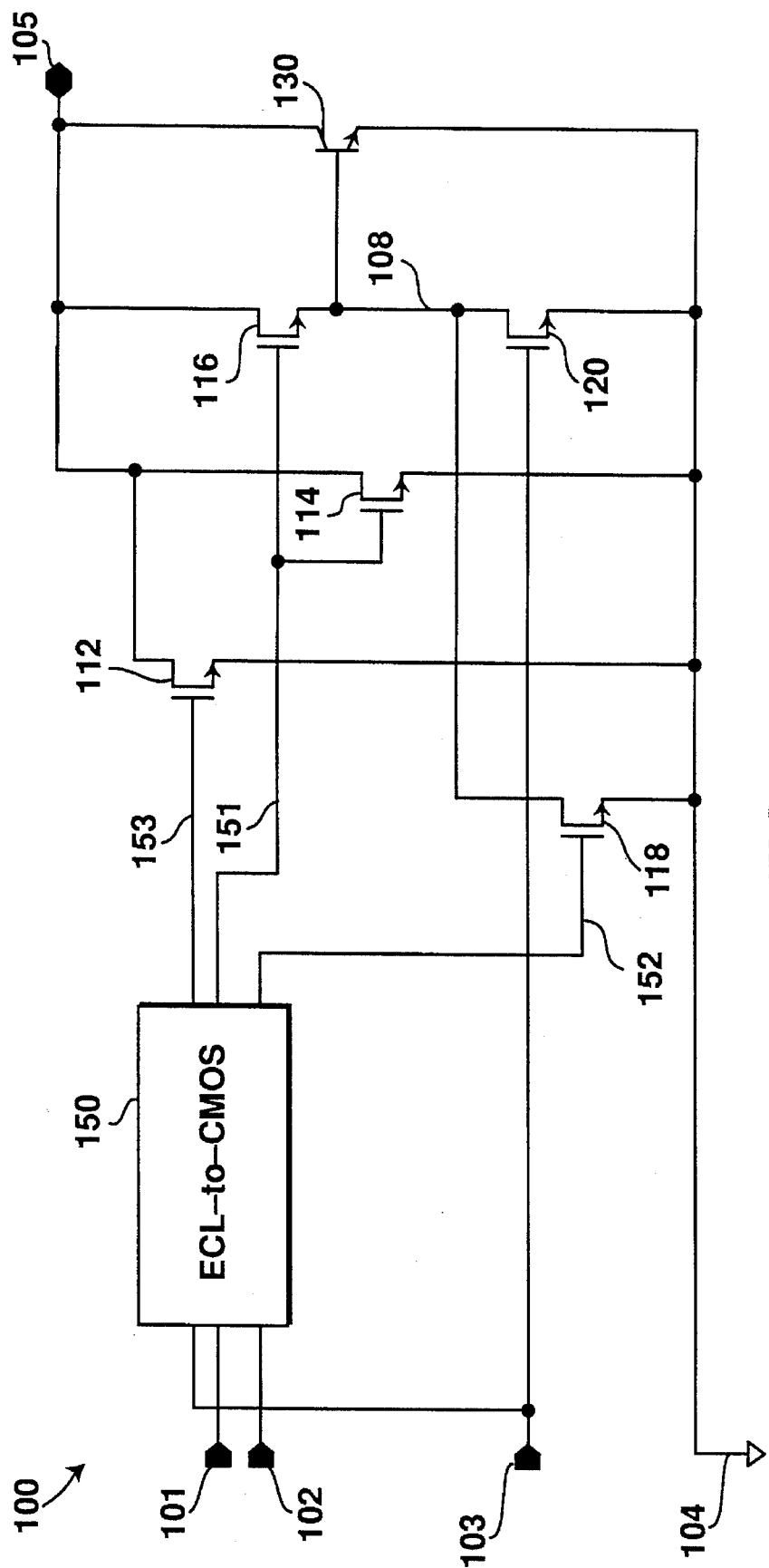
FIG. 1 illustrates circuitry for one embodiment for a pull-down output buffer.

FIG. 1 illustrates circuitry 100 for one embodiment for a pull-down output buffer. Circuitry 100 is also referred to as an electrical apparatus and a device, for example. Circuitry 100 serves as pull-down circuitry for generating and outputting a low output signal over a single bit bus line, for example.

Circuitry 100 may include, for example, Bipolar Complementary Metal Oxide Semiconductor (BiCMOS) circuitry. For this detailed description, n-channel transistors and p-channel transistors used for circuitry 100 may each include, for example, n-channel metal oxide semiconductor (NMOS) transistors and p-channel metal oxide semiconductor (PMOS) transistors, respectively.

Circuitry 100 may be configured in a digital data processing system, for example, to output address, data, or control signals over bus lines. Circuitry 100 may be configured with suitable pull-up circuitry for generating and outputting a high output signal over a single bit bus line. Circuitry 100 may be configured with other suitable output buffers to output a plurality of bits over bus lines. For example, a plurality of output buffers such as the one illustrated in FIG. 1 may be configured to simultaneously output a plurality of bits, each from a different one of the output buffers, over separate bit lines of a bus. Circuitry 100 may be configured to output data for a digital component such as a microprocessor, a data storage or memory device such as a random access memory, or a controller, for example. Circuitry 100 may be used to generate an output signal for other purposes.

Circuitry 100 is responsive to input signals gout 101, goutb 102, and selb 103 and generates and outputs an output signal dout 105. Input signals gout 101 and goutb 102 may be differential input signals with a voltage swing of approximately 1.5 Volts, for example. Input signal selb 103 is a select signal for circuitry 100. Circuitry 100 is in a selected state or active when input signal selb 103 is a low or a logical-zero signal, for example.

For this detailed description, a high signal may correspond to a logical-one signal and may have a voltage level of approximately 3.3 Volts or approximately 5.0 Volts, for example. A low signal may correspond to a logical-zero signal and may have a voltage level of approximately zero (0) Volts or approximately 1.8 Volts, for example. Other suitable voltage levels may also be used for high and low signals and may depend, for example, on the purpose for which the high or low signal is to be used.

For one embodiment, high and low signals for input signals gout 101 and goutb 102 may correspond to voltage levels of approximately 3.3 Volts, for example, and approximately 1.8 Volts, for example, respectively. A high and low signal for input signal selb 103 may correspond to approximately 5.0 Volts, for example, and approximately zero (0) Volts, for example, respectively.

Circuitry 100 undergoes a pull-down transition to output a low output signal dout 105 when circuitry 100 is in the selected state and when input signal gout 101 goes low. Circuitry 100 may receive input signal gout 101 and selb 103 from a digital component, for example, for outputting a low output signal dout 105 over a bus line for that digital component.

Figure 2:
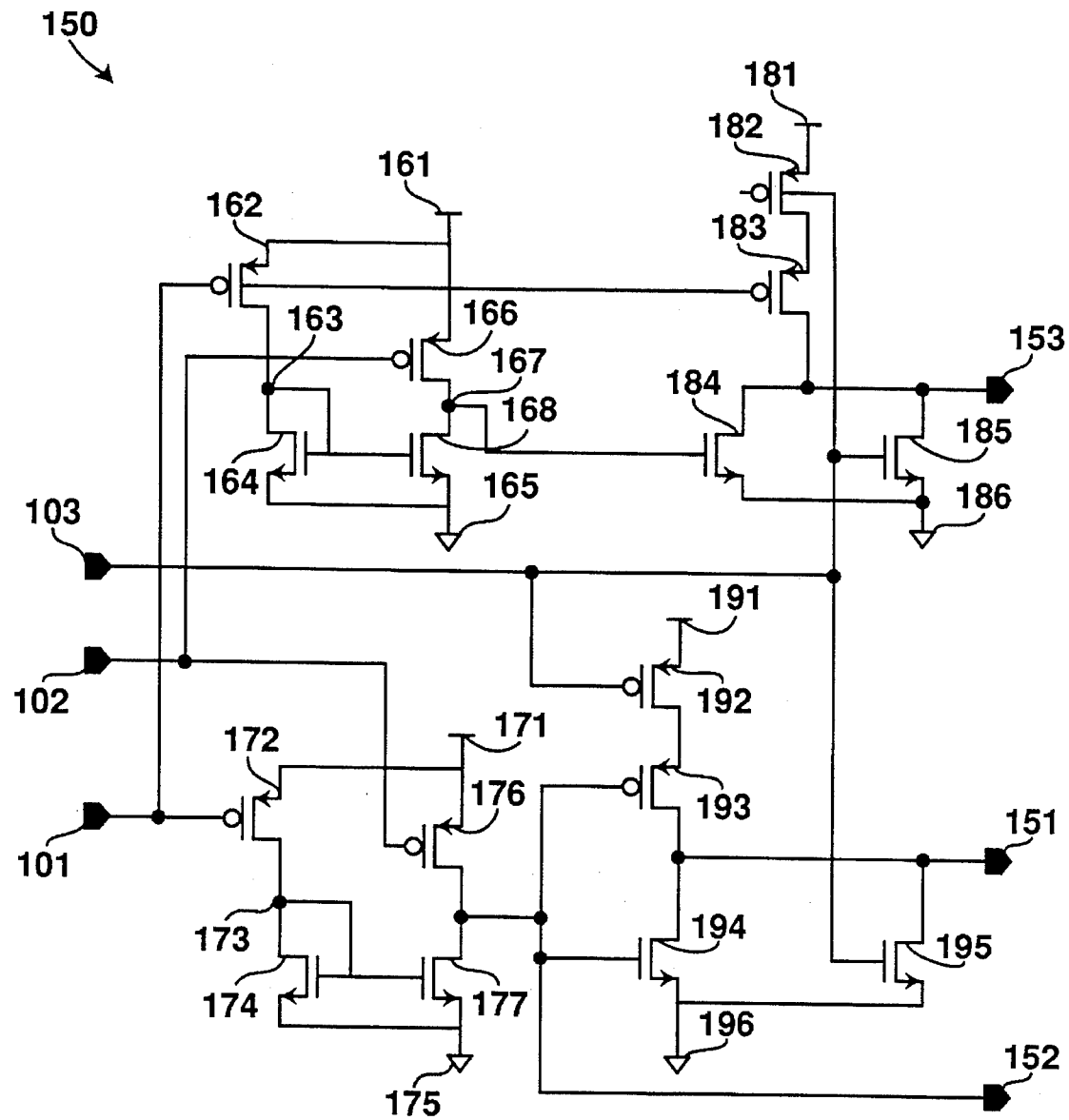
FIG. 2 illustrates circuitry for one embodiment for an ECL-to-CMOS converter stage for the pull-down output buffer of FIG. 1.

Circuitry 100 includes Emitter Coupled Logic to Complementary Metal Oxide Semiconductor (ECL-to-CMOS) converter stage 150. As illustrated in FIG. 1, ECL-to-CMOS converter stage 1150 is responsive to input signals gout 101, goutb 102, and selb 103 and generates and outputs output control signals pd 151, pdb 152, and pds 153. FIG. 2 illustrates circuitry 150 for one embodiment for ECL-to-CMOS converter stage 150. Circuitry 150 is also referred to as an electrical apparatus and a device, for example.

For a desired pull-down transition to a logical-zero or low signal on output signal dout 105, input signal gout 101 goes low and input signal goutb 102 goes high. Input signal selb 103 is low as the output buffer is to be selected. Output signal dout 105 may undergo a tristate-to-low transition, for example, when input signal gout 101 goes low and when input signal selb 103 undergoes a high-to-low transition, causing circuitry 100 to transition from the deselected to the selected state. Output signal dout 105 may also undergo a high-to-low transition, for example, when input signal gout 101 undergoes a high-to-low transition and when circuitry 100 is in the selected state.

In response to these input signals, control signal pd 151 from ECL-to-CMOS converter stage 150 goes high while control signal pdb 152 goes low. Control signal pds 153 is logically similar to control signal pd 151 and goes high. Control signal pds 153 is a relatively high fan-out node. Control signal pds 153 undergoes its transition relatively slow for noise reasons.

As illustrated in FIG. 2, circuitry 150 for one embodiment for ECL-to-CMOS converter stage 150 includes voltage terminals 161, 171, 181, and 191 and voltage terminals 165, 175, 186, and 196. Any suitable voltage level may be used for voltage terminals 161, 171, 181, and 191 and for voltage terminals 165, 175, 186, and 196. The voltage level for voltage terminals 161, 171, 181, and 191 may be approximately 15.0 Volts, for example. The voltage level for voltage terminals 165, 175, 186, and 196 may be approximately zero (0) Volts, for example.

Circuitry 150 of FIG. 2 includes p-channel transistors 172 and 176 and n-channel transistors 174 and 177. The source of p-channel transistor 172 is coupled to voltage terminal 171. The drain of n-channel transistor 174 is coupled to the drain of p-channel transistor 172 at node 173. The source of n-channel transistor 174 is coupled to voltage terminal 175.

The gate of p-channel transistor 172 is coupled to input signal gout 101. P-channel transistor 172 couples voltage terminal 171 to node 173 when p-channel transistor 172 is turned-on by a low input signal gout 101. The gate of n-channel transistor 174 is coupled to node 173. N-channel transistor 174 couples node 173 to voltage terminal 175 when n-channel transistor 174 is turned-on by a high input signal at node 173.

The source of p-channel transistor 176 is coupled to voltage terminal 171. The drain of p-channel transistor 176 is coupled to the drain of n-channel transistor 177 at node or control signal pdb 152. The source of n-channel transistor 177 is coupled to voltage terminal 175.

The gate of p-channel transistor 176 is coupled to input signal goutb 102. P-channel transistor 176 couples voltage terminal 171 to node 152 when p-channel transistor 176 is turned-on by a low input signal goutb 102. The gate of n-channel transistor 177 is coupled to node 173. N-channel transistor 177 couples node 152 to voltage terminal 175 when n-channel transistor 177 is turned-on by a high input signal at node 173.

As input signal gout 101 goes low and goutb 102 goes high, p-channel transistor 172 is turned-on and p-channel transistor 176 is turned-off, respectively. P-channel transistor 172 couples voltage terminal 171 to node 173, turning-on n-channel transistors 174 and 177. When n-channel transistor 177 is turned-on, control signal pdb 152 is forced low as n-channel transistor 177 couples control signal pdb 152 to voltage terminal 175.

Circuitry 150 of FIG. 2 also includes p-channel transistors 192–193 and n-channel transistors 194–195. The source of p-channel transistor 192 is coupled to voltage terminal 191. The drain of p-channel transistor 192 is coupled to the source of p-channel transistor 193. The drain of p-channel transistor 193 is coupled to the drain of n-channel transistor 194 at node or control signal pd 151. The source of n-channel transistor 194 is coupled to voltage terminal 196. The drain of n-channel transistor 195 is coupled to node or control signal pd 151. The source of n-channel transistor 195 is coupled to voltage terminal 196.

The gate of p-channel transistor 192 is coupled to input signal selb 103. P-channel transistor 192 couples voltage terminal 191 to the source of p-channel transistor 193 when p-channel transistor 192 is turned-on by a low input signal selb 103. The gate of p-channel transistor 193 is coupled to node or control signal pdb 152. P-channel transistor 193 couples voltage terminal 191 (when p-channel transistor 192 is turned-on) to node or control signal pd 151 when p-channel transistor 193 is turned-on by a low signal at node 152. The gate of n-channel transistor 194 is coupled to node or control signal pdb 152. N-channel transistor 194 couples node or control signal pd 151 to voltage terminal 196 when n-channel transistor 194 is turned-on by a high signal at node 152. The gate of n-channel transistor 195 is coupled to input signal selb 103. N-channel transistor 195 couples node or control signal pd 151 to voltage terminal 196 when n-channel transistor 195 is turned-on by a high input signal selb 103.

P-channel transistor 193 and n-channel transistor 194 are configured as an inverter, inverting control signal pdb 152 as control signal pd 151.

When control signal pdb 152 is forced low as a result of gout 101 going low and goutb 102 going high, p-channel transistor 193 is turned-on and n-channel transistor 194 is turned-off. Because p-channel transistor 192 is turned-on by input signal selb 103 being low, voltage terminal 191 forces control signal pd 151 high through p-channel transistor 193. N-channel transistor 195 is turned-off by input signal selb 103 being low, and hence does not couple control signal pd 151 to voltage terminal 196.

Circuitry 150 of FIG. 2 further includes p-channel transistors 162 and 166 and n-channel transistors 164 and 168. The source of p-channel transistor 162 is coupled to voltage terminal 161. The drain of n-channel transistor 164 is coupled to the drain of p-channel transistor 162 at node 163. The source of n-channel transistor 164 is coupled to voltage terminal 165.

The gate of p-channel transistor 162 is coupled to input signal gout 101. P-channel transistor 162 couples voltage terminal 161 to node 163 when p-channel transistor 162 is turned-on by a low input signal gout 101. The gate of n-channel transistor 164 is coupled to node 163. N-channel transistor 164 couples node 163 to voltage terminal 165 when n-channel transistor 164 is turned-on by a high input signal at node 163.

The source of p-channel transistor 166 is coupled to voltage terminal 161. The drain of p-channel transistor 166 is coupled to the drain of n-channel transistor 168 at node 167. The source of n-channel transistor 168 is coupled to voltage terminal 165.

The gate of p-channel transistor 166 is coupled to input signal goutb 102. P-channel transistor 166 couples voltage terminal 161 to node 167 when p-channel transistor 166 is turned-on by a low input signal goutb 102. The gate of n-channel transistor 168 is coupled to node 163. N-channel transistor 168 couples node 167 to voltage terminal 165 when n-channel transistor 168 is turned-on by a high input signal at node 163.

As input signal gout 101 goes low and goutb 102 goes high, p-channel transistor 162 is turned-on and p-channel transistor 166 is turned-off, respectively. P-channel transistor 162 couples voltage terminal 161 to node 163, turning-on n-channel transistors 164 and 168. When n-channel transistor 168 is turned-on, node 167 is forced low as n-channel transistor 168 couples node 167 to voltage terminal 165.

Circuitry 150 of FIG. 2 further includes p-channel transistors 182–183 and n-channel transistors 184–185. The source of p-channel transistor 182 is coupled to voltage terminal 181. The drain of p-channel transistor 182 is coupled to the source of p-channel transistor 183. The drain of p-channel transistor 183 is coupled to node or control signal pds 153. The drain of n-channel transistor 184 is coupled to the drain of p-channel transistor 183 at node 153. The source of n-channel transistor 184 is coupled to voltage terminal 186. The drain of n-channel transistor 185 is coupled to the drain of p-channel transistor 183 at node 153. The source of n-channel transistor 185 is coupled to voltage terminal 186.

The gate of p-channel transistor 182 is coupled to input signal selb 103. P-channel transistor 182 couples voltage terminal 181 to the source of p-channel transistor 183 when p-channel transistor 182 is turned-on by a low input signal selb 103. The gate of p-channel transistor 183 is coupled to input signal gout 101. P-channel transistor 183 couples voltage terminal 181 (when p-channel transistor 182 is turned-on) to node or control signal pds 153 when p-channel transistor 183 is turned-on by a low input signal gout 101. The gate of n-channel transistor 184 is coupled to node 167. N-channel transistor 184 couples node or control signal pds 153 to voltage terminal 186 when n-channel transistor 184 is turned-on by a high signal at node 167. The gate of n-channel transistor 185 is coupled to input signal selb 103. N-channel transistor 185 couples node or control signal pds 153 to voltage terminal 186 when n-channel transistor 185 is turned-on by a high input signal selb 103.

When gout 101 goes low, p-channel transistor 183 is turned-on. When node 167 is forced low as a result of gout 101 going low and goutb 102 going high, n-channel transistor 184 is turned-off. Because p-channel transistor 182 is turned-on by input signal selb 103 being low, voltage terminal 181 forces control signal pds 153 high through p-channel transistor 183. N-channel transistor 185 is turned-off by input signal selb 103 being low, and hence does not couple control signal pds 153 to voltage terminal 186.

For one embodiment where an approximately 0.5 μm channel length technology is used, each transistor for circuitry 150 may have an approximate width as listed in Table I, for example. Other suitable channel lengths and widths may also be used for each transistor for circuitry 150.

TABLE I

| TRANSISTOR | APPROXIMATE WIDTH |
|---|---|
| p-channel 162 | 7.0 μm |
| n-channel 164 | 3.5 μm |
| p-channel 166 | 15.8 μm |
| n-channel 168 | 7.9 μm |
| p-channel 172 | 8.0 μm |
| n-channel 174 | 4.0 μm |
| p-channel 176 | 32.0 μm |
| n-channel 177 | 16.0 μm |
| p-channel 182 | 94.8 μm |
| p-channel 183 | 47.4 μm |
| n-channel 184 | 65.7 μm |
| n-channel 185 | 43.8 μm |
| p-channel 192 | 131.4 μm |
| p-channel 193 | 87.6 μm |
| n-channel 194 | 43.8 μm |

TABLE I-continued

| TRANSISTOR | APPROXIMATE WIDTH |
|---|---|
| n-channel 195 | 43.8 μm |

As illustrated in FIG. 1, circuitry 100 includes n-channel transistors 112, 114, 116, 118, and 120, npn bipolar transistor 130, and voltage terminal 104. Any suitable voltage level, such as approximately zero (0) Volts for example, may be used for voltage terminal 104.

The drain of n-channel transistor 112 is coupled to node or output signal dout 105. The source of n-channel transistor 112 is coupled to voltage terminal 104. The drain of n-channel transistor 114 is coupled to node or output signal dout 105. The source of n-channel transistor 114 is coupled to voltage terminal 104. The drain of n-channel transistor 116 is coupled to node or output signal dout 105. The source of n-channel transistor 116 is coupled to the drain of n-channel transistor 120 at node 108. The source of n-channel transistor 120 is coupled to voltage terminal 104. The drain of n-channel transistor 118 is coupled to node 108. The source of n-channel transistor 118 is coupled to voltage terminal 104. The collector of npn bipolar transistor 130 is coupled to node or output signal dout 105. The emitter of npn bipolar transistor 130 is coupled to voltage terminal 104.

The gate of n-channel transistor 112 is coupled to control signal pds 153. N-channel transistor 112 couples node or output signal dout 105 to voltage terminal 104 when n-channel transistor 112 is turned-on by a high control signal pds 153. The gate of n-channel transistor 114 is coupled to control signal pd 151. N-channel transistor 114 couples node or output signal dout 105 to voltage terminal 104 when n-channel transistor 114 is turned-on by a high control signal pd 151. The gate of n-channel transistor 116 is coupled to control signal pd 151. N-channel transistor 116 couples node or output signal dout 105 to node 108 when n-channel transistor 116 is turned-on by a high control signal pd 151. N-channel transistor 116 is in a source follower mode. N-channel transistors 114 and 116 may be relatively smaller MOS devices as compared to transistor 112.

The gate of n-channel transistor 118 is coupled to control signal pdb 152. N-channel transistor 118 couples node 108 to voltage terminal 104 when n-channel transistor 118 is turned-on by a high control signal pdb 152. The gate of n-channel transistor 120 is coupled to input signal selb 103. N-channel transistor 120 couples node 108 to voltage terminal 104 when n-channel transistor 120 is turned-on by a high input signal selb 103. The base of npn bipolar transistor 130 is coupled to node 108. Bipolar transistor 130 couples output signal dout 105 to voltage terminal 104.

For the output buffer illustrated in FIGS. 1–2, output signal dout 105 undergoes the pull-down transition in a staggered fashion in response to gout 101 going low and goutb 102 going high.

First, control signal pd 151 goes high, starting a relatively slow pull-down transition for output signal dout 105 as output signal dout 105 becomes coupled to voltage terminal 104 through n-channel transistor 114. N-channel transistor 116, that is in a source follower mode, is then turned-on by a high control signal pd 151 and couples output signal dout 105 to node 108. Bipolar transistor 130 is turned-on by the signal at node 108, resulting in a relatively rapid pull-down transition for output signal dout 105 as bipolar transistor 130 couples output signal dout 105 to voltage terminal 104. When output signal dout 105 reaches the voltage level between the base and emitter ($V_{be}$) of bipolar transistor 130, however, bipolar transistor 130 shuts off. Bipolar transistor 130 thus does not completely pull-down output signal dout 105 to voltage terminal 104. At this time n-channel transistor 112, that is turned-on by control signal pds 153, completes the pull-down of output signal dout 105 by coupling node or output signal dout 105 to voltage terminal 104.

For one embodiment where an approximately 0.5 μm channel length technology is used, each transistor for circuitry 100 may have an approximate width as listed in Table II, for example. Other suitable channel lengths and widths may also be used for each transistor for circuitry 100.

TABLE II

| TRANSISTOR | APPROXIMATE WIDTH |
|---|---|
| n-channel 112 | 472 μm |
| n-channel 114 | 59 μm |
| n-channel 116 | 120 μm |
| n-channel 118 | 17.5 μm |
| n-channel 120 | 17.5 μm |

Bipolar transistor 130 may have an emitter area of approximately 52.8 μm$^2$, for example. Other suitable emitter areas may also be used for bipolar transistor 130.

Figure 3:
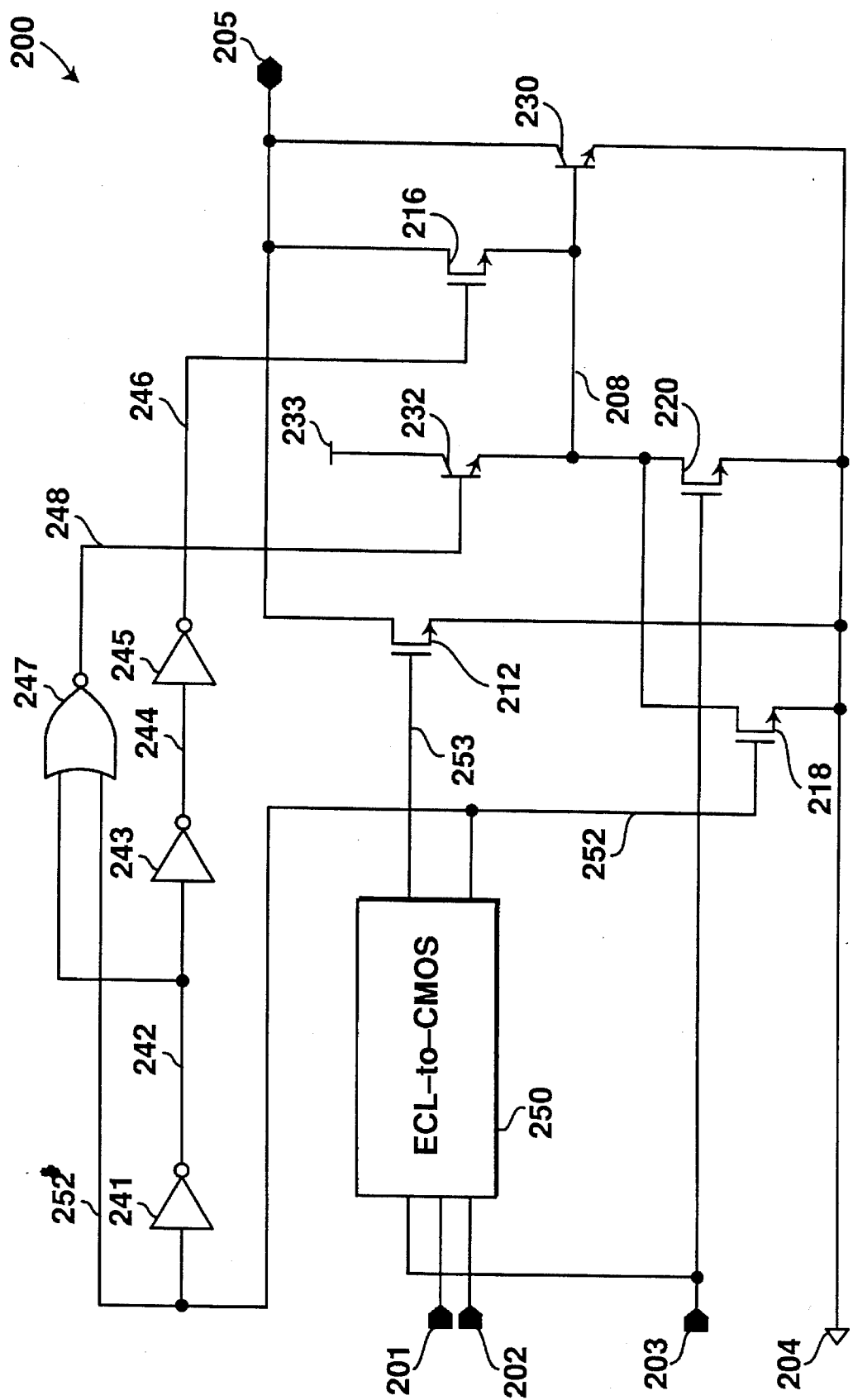
FIG. 3 illustrates circuitry for another embodiment for a pull-down output buffer.

FIG. 3 illustrates circuitry 200 for one embodiment for a pull-down output buffer. Circuitry 200 is also referred to as an electrical apparatus and a device, for example. Circuitry 200 serves as pull-down circuitry for generating and outputting a low output signal over a single bit bus line, for example.

Circuitry 200 may include, for example, Bipolar Complementary Metal Oxide Semiconductor (BiCMOS) circuitry. For this detailed description, n-channel transistors and p-channel transistors used for circuitry 200 may each include, for example, n-channel metal oxide semiconductor (NMOS) transistors and p-channel metal oxide semiconductor (PMOS) transistors, respectively.

Circuitry 200 may be configured in a digital data processing system, for example, to output address, data, or control signals over bus lines. Circuitry 200 may be configured with suitable pull-up circuitry for generating and outputting a high output signal over a single bit bus line. Circuitry 200 may be configured with other suitable output buffers to output a plurality of bits over bus lines. For example, a plurality of output buffers such as the one illustrated in FIG. 3 may be configured to simultaneously output a plurality of bits, each from a different one of the output buffers, over separate bit lines of a bus. Circuitry 200 may be configured to output data for a digital component such as a microprocessor, a data storage or memory device such as a static random access memory (SRAM), or a controller, for example. Circuitry 200 may be used to generate an output signal for other purposes.

Circuitry 200 is responsive to input signals gout 201, goutb 202, and selb 203 and generates and outputs an output signal dout 205. Input signals gout 201 and goutb 202 may be differential input signals with a voltage swing of approximately 1.5 Volts, for example. Input signals gout 201 and goutb 202 may be generated using only a single input signal as the binary complement of the single input signal may be generated and inputted along with the single input signal. An inverter may be used, for example, to generate input signal goutb 202 using input signal gout 201. Input signal selb 203 is a select signal for circuitry 200. Circuitry 200 is in a selected state or active when input signal selb 203 is a low or a logical-zero signal, for example.

For this detailed description, a high signal may correspond to a logical-one signal and may have a voltage level of approximately 3.3 Volts or approximately 5.0 Volts, for example. A low signal may correspond to a logical-zero signal and may have a voltage level of approximately zero (0) Volts or approximately 1.8 Volts, for example. Other suitable voltage levels may also be used for high and low signals and may depend, for example, on the purpose for which the high or low signal is to be used.

For one embodiment, high and low signals for input signals gout 201 and goutb 202 may correspond to voltage levels of approximately 3.3 Volts, for example, and approximately 1.8 Volts, for example, respectively. A high and low signal for input signal selb 203 may correspond to approximately 5.0 Volts, for example, and approximately zero (0) Volts, for example, respectively.

Circuitry 200 undergoes a pull-down transition to output a low output signal dout 205 when circuitry 200 is in the selected state and when input signal gout 201 goes low. Circuitry 200 may receive input signal gout 201 and selb 203 from a digital component, for example, for outputting a low output signal dout 205 over a bus line for that digital component.

Figure 4:
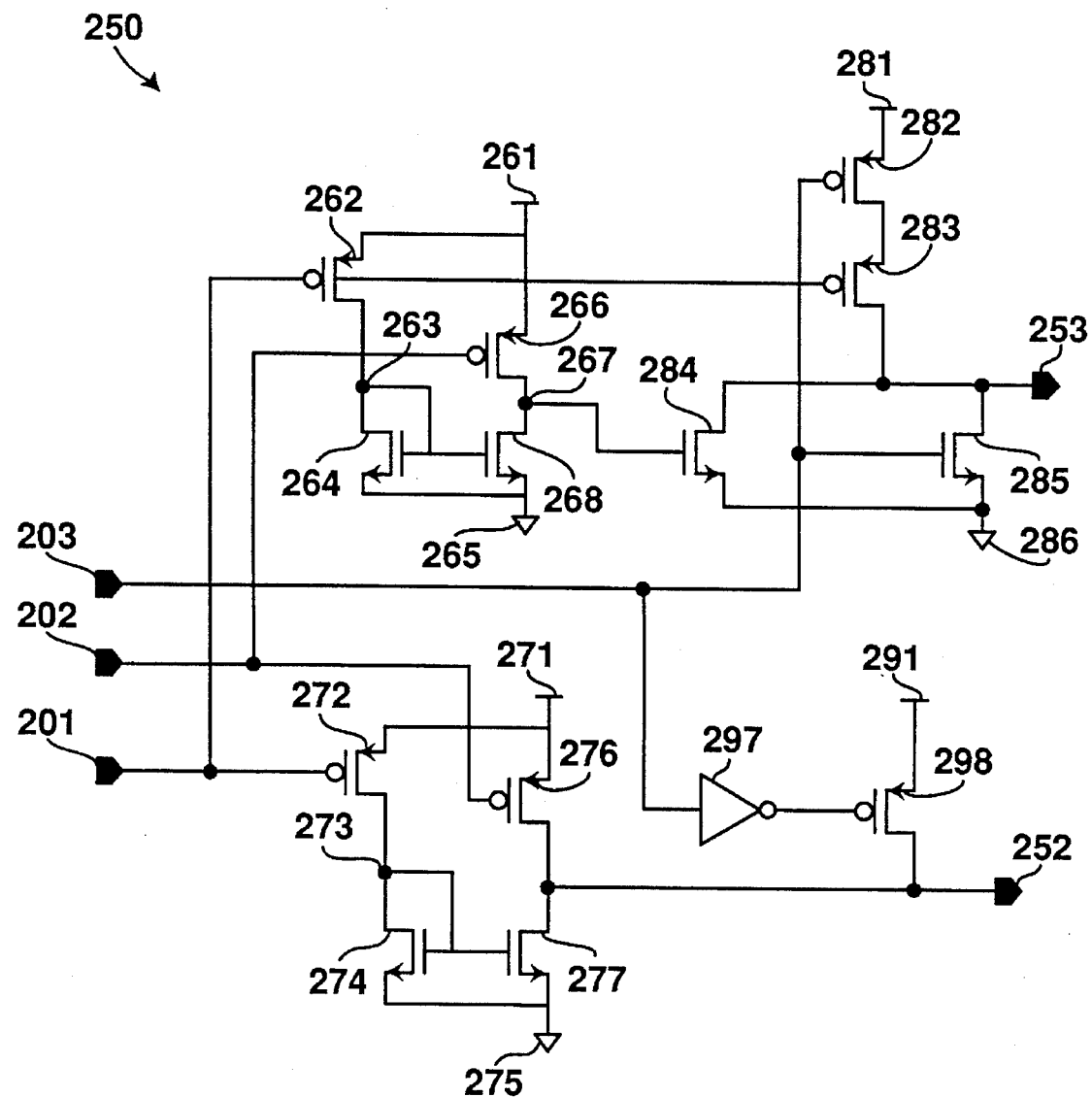
FIG. 4 illustrates circuitry for one embodiment for an ECL-to-CMOS converter stage for the pull-down output buffer of FIG. 3.

Circuitry 200 includes Emitter Coupled Logic to Complementary Metal Oxide Semiconductor (ECL-to-CMOS) converter stage 250. As illustrated in FIG. 3, ECL-to-CMOS converter stage 250 is responsive to input signals gout 201, goutb 202, and selb 203 and generates and outputs output control signals pdb 252 and pds 253. FIG. 4 illustrates circuitry 250 for one embodiment for ECL-to-CMOS converter stage 250. Circuitry 250 is also referred to as an electrical apparatus and a device, for example.

For a desired pull-down transition to a logical-zero or low signal on output signal dout 205, input signal gout 201 goes low and input signal goutb 202 goes high. Input signal selb 203 is low as the output buffer is to be selected. Output signal dout 205 may undergo a tristate-to-low transition, for example, when input signal gout 201 goes low and when input signal selb 203 undergoes a high-to-low transition, causing circuitry 200 to transition from the deselected to the selected state. Output signal dout 205 may also undergo a high-to-low transition, for example, when input signal gout 201 undergoes a high-to-low transition and circuitry 200 is in the selected state.

In response to these input signals, control signal pdb 252 from ECL-to-CMOS converter stage 250 goes low. Control signal pds 253 is similar to the logical complement of control signal pdb 252 and goes high. Control signal pds 253 is a relatively high fan-out node. Control signal pds 253 undergoes its transition relatively slow for noise reasons.

As illustrated in FIG. 4, circuitry 250 for one embodiment for ECL-to-CMOS converter stage 250 includes voltage terminals 261, 271, 281, and 291 and voltage terminals 265, 275, and 286. Any suitable voltage level may be used for voltage terminals 261, 271, 281, and 291 and for voltage terminals 265, 275, and 286. The voltage level for voltage terminals 261, 271, 281, and 291 may be approximately 5.0 Volts, for example. The voltage level for voltage terminals 265, 275, and 286 may be approximately zero (0) Volts, for example.

Circuitry 250 of FIG. 4 includes p-channel transistors 272 and 276 and n-channel transistors 274 and 277. The source of p-channel transistor 272 is coupled to voltage terminal 271. The drain of n-channel transistor 274 is coupled to the drain of p-channel transistor 272 at node 273. The source of n-channel transistor 274 is coupled to voltage terminal 275.

The gate of p-channel transistor 272 is coupled to input signal gout 201. P-channel transistor 272 couples voltage terminal 271 to node 273 when p-channel transistor 272 is turned-on by a low input signal gout 201. The gate of n-channel transistor 274 is coupled to node 273. N-channel transistor 274 couples node 273 to voltage terminal 275 when n-channel transistor 274 is turned-on by a high input signal at node 273.

The source of p-channel transistor 276 is coupled to voltage terminal 271. The drain of p-channel transistor 276 is coupled to the drain of n-channel transistor 277 at node or control signal pdb 252. The source of n-channel transistor 277 is coupled to voltage terminal 275.

The gate of p-channel transistor 276 is coupled to input signal goutb 202. P-channel transistor 276 couples voltage terminal 271 to node 252 when p-channel transistor 276 is turned-on by a low input signal goutb 202. The gate of n-channel transistor 277 is coupled to node 273. N-channel transistor 277 couples node 252 to voltage terminal 275 when n-channel transistor 277 is turned-on by a high input signal at node 273.

As input signal gout 201 goes low and goutb 202 goes high, p-channel transistor 272 is turned-on and p-channel transistor 276 is turned-off, respectively. P-channel transistor 272 couples voltage terminal 271 to node 273, turning-on n-channel transistors 274 and 277. When n-channel transistor 277 is turned-on, control signal pdb 252 is forced low as n-channel transistor 277 couples control signal pdb 252 to voltage terminal 275.

Circuitry 250 of FIG. 4 also includes inverter 297 and p-channel transistor 298. The source of p-channel transistor 298 is coupled to voltage terminal 291. The drain of p-channel transistor 298 is coupled to node or control signal pdb 252. The input of inverter 297 is coupled to input signal selb 203. The output of inverter 297 is coupled to the gate of p-channel transistor 298. Inverter 297 may have a delay of approximately 250 picoseconds, for example, in inverting input signal selb 203. Inverter 297 may be configured to have other suitable delays that may depend, for example, on the technology used. P-channel transistor 298 couples voltage terminal 291 to node or control signal pdb 252 when p-channel transistor 298 is turned-on by a low signal output from inverter 297, corresponding to a high input signal selb 203.

Because input signal selb 203 is low when the output buffer is selected for the desired pull-down transition for output signal dout 205, p-channel transistor 298 is turned-off.

Circuitry 250 of FIG. 4 further includes p-channel transistors 262 and 266 and n-channel transistors 264 and 268. The source of p-channel transistor 262 is coupled to voltage terminal 261. The drain of n-channel transistor 264 is coupled to the drain of p-channel transistor 262 at node 263. The source of n-channel transistor 264 is coupled to voltage terminal 265.

The gate of p-channel transistor 262 is coupled to input signal gout 201. P-channel transistor 262 couples voltage terminal 261 to node 263 when p-channel transistor 262 is turned-on by a low input signal gout 201. The gate of n-channel transistor 264 is coupled to node 263. N-channel transistor 264 couples node 263 to voltage terminal 265 when n-channel transistor 264 is turned-on by a high input signal at node 263.

The source of p-channel transistor 266 is coupled to voltage terminal 261. The drain of p-channel transistor 266 is coupled to the drain of n-channel transistor 268 at node 267. The source of n-channel transistor 268 is coupled to voltage terminal 265.

The gate of p-channel transistor 266 is coupled to input signal goutb 202. P-channel transistor 266 couples voltage terminal 261 to node 267 when p-channel transistor 266 is turned-on by a low input signal goutb 202. The gate of n-channel transistor 268 is coupled to node 263. N-channel transistor 268 couples node 267 to voltage terminal 265 when n-channel transistor 268 is turned-on by a high input signal at node 263.

As input signal gout 201 goes low and goutb 202 goes high, p-channel transistor 262 is turned-on and p-channel transistor 266 is turned-off, respectively. P-channel transistor 262 couples voltage terminal 261 to node 263, turning-on n-channel transistors 264 and 268. When n-channel transistor 268 is turned-on, node 267 is forced low as n-channel transistor 268 couples node 267 to voltage terminal 265.

Circuitry 250 of FIG. 4 further includes p-channel transistors 282–283 and n-channel transistors 284–285. The source of p-channel transistor 282 is coupled to voltage terminal 281. The drain of p-channel transistor 282 is coupled to the source of p-channel transistor 283. The drain of p-channel transistor 283 is coupled to node or control signal pds 253. The drain of n-channel transistor 284 is coupled to the drain of p-channel transistor 283 at node 253. The source of n-channel transistor 284 is coupled to voltage terminal 286. The drain of n-channel transistor 285 is coupled to the drain of p-channel transistor 283 at node 253. The source of n-channel transistor 285 is coupled to voltage terminal 286.

The gate of p-channel transistor 282 is coupled to input signal selb 203. P-channel transistor 282 couples voltage terminal 281 to the source of p-channel transistor 283 when p-channel transistor 282 is turned-on by a low input signal selb 203. The gate of p-channel transistor 283 is coupled to input signal gout 201. P-channel transistor 283 couples voltage terminal 281 (when p-channel transistor 282 is turned-on) to node or control signal pds 253 when p-channel transistor 283 is turned-on by a low input signal gout 201. The gate of n-channel transistor 284 is coupled to node 267. N-channel transistor 284 couples node or control signal pds 253 to voltage terminal 286 when n-channel transistor 284 is turned-on by a high signal at node 267. The gate of n-channel transistor 285 is coupled to input signal selb 203. N-channel transistor 285 couples node or control signal pds 253 to voltage terminal 286 when n-channel transistor 285 is turned-on by a high input signal selb 203.

When gout 201 goes low, p-channel transistor 283 is turned-on. When node 267 is forced low as a result of gout 201 going low and goutb 202 going high, n-channel transistor 284 is turned-off. Because p-channel transistor 282 is turned-on by input signal selb 203 being low, voltage terminal 281 forces control signal pds 253 high through p-channel transistor 283. N-channel transistor 285 is turned-off by input signal selb 203 being low, and hence does not couple control signal pds 253 to voltage terminal 286.

For one embodiment where an approximately 0.5 μm channel length technology is used, each transistor for circuitry 250 may have an approximate width as listed in Table III, for example. Other suitable channel lengths and widths may also be used for each transistor for circuitry 250.

TABLE III

| TRANSISTOR | APPROXIMATE WIDTH |
| --- | --- |
| p-channel 262 | 7.0 μm |
| n-channel 264 | 3.5 μm |
| p-channel 266 | 15.8 μm |
| n-channel 268 | 7.9 μm |
| p-channel 272 | 8.0 μm |
| n-channel 274 | 4.0 μm |

TABLE III-continued

| TRANSISTOR | APPROXIMATE WIDTH |
| --- | --- |
| p-channel 276 | 32.0 μm |
| n-channel 277 | 16.0 μm |
| p-channel 282 | 94.8 μm |
| p-channel 283 | 47.4 μm |
| n-channel 284 | 65.7 μm |
| n-channel 285 | 43.8 μm |
| p-channel 298 | 20.0 μm |

Inverter 297 may be designed with any suitable technology, such as CMOS technology for example. Inverter 297 may include an approximately 4.0 μm wide p-channel transistor, for example, and an approximately 4.0 μm wide n-channel transistor, for example. Inverter 297 may include transistors having other suitable channel lengths and widths. As illustrated in FIG. 3, circuitry 200 includes n-channel transistors 212, 216, 218, and 220, npn bipolar transistors 230 and 232, inverters 241, 243, and 245, NOR gate 247, voltage terminal 233, and voltage terminal 204. Any suitable voltage level, such as approximately 5.0 Volts for example, may be used for voltage terminal 233. Any suitable voltage level, such as approximately zero (0) Volts for example, may be used for voltage terminal 204.

The drain of n-channel transistor 212 is coupled to node or output signal dout 205. The source of n-channel transistor 212 is coupled to voltage terminal 204. The collector of npn bipolar transistor 232 is coupled to voltage terminal 233. The emitter of npn bipolar transistor 232 is coupled to node 208. The drain of n-channel transistor 216 is coupled to node or output signal dout 205. The source of n-channel transistor 216 is coupled to node 208. The drain of n-channel transistor 220 is coupled to node 208. The source of n-channel transistor 220 is coupled to voltage terminal 204. The drain of n-channel transistor 218 is coupled to node 208. The source of n-channel transistor 218 is coupled to voltage terminal 204. The collector of npn bipolar transistor 230 is coupled to node or output signal dout 205. The emitter of npn bipolar transistor 230 is coupled to voltage terminal 204.

The gate of n-channel transistor 212 is coupled to control signal pds 253. N-channel transistor 212 couples node or output signal dout 205 to voltage terminal 204 when n-channel transistor 212 is turned-on by a high control signal pds 253. The gate of n-channel transistor 218 is coupled to control signal pdb 252. N-channel transistor 218 couples node 208 to voltage terminal 204 when n-channel transistor 218 is turned-on by a high control signal pdb 252. The gate of n-channel transistor 220 is coupled to input signal selb 203. N-channel transistor 220 couples node 208 to voltage terminal 204 when n-channel transistor 220 is turned-on by a high input signal selb 203. The base of npn bipolar transistor 230 is coupled to node 208. Bipolar transistor 230 couples output signal dout 205 to voltage terminal 204.

The input of inverter 241 is coupled to control signal pdb 252. The input of inverter 243 is coupled to an output control signal 242 from inverter 241. The input of inverter 245 is coupled to an output control signal 244 from inverter 243. An output control signal 246 of inverter 245 is coupled to the gate of n-channel transistor 216. N-channel transistor 216 couples node or output signal dour 205 to node 208 when n-channel transistor 216 is turned-on by a high control signal 246 from inverter 245.

Inverter 241 serves as an inverting delay for control signal pdb 252. Inverter 241 may have a delay of approximately 250 picoseconds, for example. Inverter 241 may be configured to have other suitable delays that may depend, for example, on the technology used. Inverters 243 and 245 serve as a non-inverting delay for control signal 242 from inverter 241. Inverters 243 and 245 may each have a delay of approximately 250 picoseconds, for example. Inverters 243 and 245 may each have other suitable delays that may depend, for example, on the technology used.

NOR gate 247 has an input coupled to control signal pdb 252 and an input coupled to control signal 242. NOR gate 247 outputs a control signal 248 that is coupled to the base of npn bipolar transistor 232. Bipolar transistor 232 couples voltage terminal 233 to node 208. NOR gate 247 may have a delay of approximately 300 picoseconds, for example. NOR gate 247 may have other suitable delays that may depend, for example, on the technology used.

For the output buffer illustrated in FIGS. 3–4, output signal dout 205 undergoes the pull-down transition in response to gout 201 going low and goutb 202 going high.

As control signal pdb 252 goes low as a result of gout 201 going low and goutb 202 going high, NOR gate 247 receives as inputs a low control signal 242 from inverter 241 and a low control signal pdb 252. At this point, inverter 241 has not yet outputted a high control signal 242 in response to the low control signal pdb 252. In response, NOR gate 247 outputs a high control signal 248, turning-on bipolar transistor 232 and thus coupling voltage terminal 233 to node 208. This results in a relatively quicker pull-up transition at node 208 as compared to that at node 108 for the pull-down buffer illustrated in FIGS. 1–2. Bipolar transistor 230 is turned-on by the high control signal at node 208, starting a relatively rapid pull-down transition for output signal dout 205 as bipolar transistor 230 couples output signal dour 205 to voltage terminal 204. Overall, output signal dour 205 begins discharging relatively quicker as compared to the discharge of output signal dout 105 for the pull-down buffer illustrated in FIGS. 1–2.

Inverter 241 subsequently outputs a high control signal 242 in response to the low control signal pdb 252. This causes NOR gate 247 to output a low control signal 248, shutting off bipolar transistor 232, and causes non-inverting delay inverters 243 and 245 to output a high control signal 246, turning-on n-channel transistor 216. N-channel transistor 216 couples output signal dour 205 to node 208.

In response to being turned-on by the control signal at node 208, bipolar transistor 230 discharges output signal dour 205 until output signal dout 205 reaches the voltage level between the base and emitter ($V_{be}$) of bipolar transistor 230. Bipolar transistor 230, however, is then shut off. Bipolar transistor 230 thus does not completely pull-down output signal dout 205 to voltage terminal 204.

If bipolar transistor 230 does not discharge output signal dout 205 to $V_{be}$ by the time n-channel transistor 216 is turned-on, bipolar transistor 230 continues to discharge output signal dout 205 as n-channel transistor 216 couples output signal dout 205 to node 208. If bipolar transistor 230 has discharged output signal dout 205 to $V_{be}$ by the time n-channel transistor 216 is turned-on, then n-channel transistor 216 helps to discharge the base of bipolar transistor 230 and equilibrate node 208 and output signal dour 205.

N-channel transistor 212, that is turned-on by control signal pds 253, completes the pull-down of output signal dour 205 by coupling node or output signal dout 205 to voltage terminal 204.

For one embodiment where an approximately 0.5 μm channel length technology is used, each transistor for circuitry 200 may have an approximate width as listed in Table IV, for example. Other suitable channel lengths and widths may also be used for each transistor for circuitry 200.

TABLE IV

| TRANSISTOR | APPROXIMATE WIDTH |
|---|---|
| n-channel 212 | 531.0 μm |
| n-channel 216 | 75.0 μm |
| n-channel 218 | 10.0 μm |
| n-channel 220 | 17.5 μm |

Bipolar transistors 230 and 232 may have emitter areas of approximately 220 μm$^2$, for example, and of approximately 11 μm$^2$, for example, respectively. Other suitable emitter areas may also be used for each bipolar transistor 230 and 232.

NOR gate 247 and inverters 241, 243, and 245 may be designed with any suitable technology. NOR gate 247 may be designed, for example, with CMOS technology and may include an approximately 60 μm wide p-channel transistor, for example, and an approximately 10 μm wide n-channel transistor, for example. Inverters 241, 243, and 245 may be designed with CMOS technology, for example. Inverter 241 may include an approximately 15 μm wide p-channel transistor, for example, and an approximately 10 μm wide n-channel transistor, for example. Inverter 243 may include an approximately 6 μm wide p-channel transistor, for example, and an approximately 6 μm wide n-channel transistor, for example. Inverter 245 may include an approximately 20 μm wide p-channel transistor, for example, and an approximately 16 μm wide n-channel transistor, for example. NOR gate 247 and inverters 241, 243, and 245 may include transistors having other suitable channel lengths and widths.

The device sizes and delays for the circuit elements for the output buffer illustrated in FIGS. 3–4 may be suitably adjusted, for example, to obtain different slew rates on node 208 and output signal dour 205.

For other embodiments, other suitable circuitry may be used for generating control signals, such as control signals 246 and 248, in a manner similarly as described above in response to control signal pdb 252. That is, other suitable circuitry may be used in place of the configuration of inverters 241, 243, and 245 with NOR gate 247 for generating control signals to control bipolar transistor 232 and n-channel transistor 216. For example, a suitable NAND gate may be configured with other suitable circuitry, including inverters for example, for generating control signals 246 and 248 in a manner similarly as described above in response to control signal pdb 252. Also, other delay devices may used in place of the non-inverting delay configuration of inverters 243 and 245 for delaying the generation of control signal 246 in response to control signal 242.

Furthermore, other suitable circuitry may be used for controlling the control signal at node 208 in a manner similarly as described above in response to control signal pdb 252. That is, other circuitry may be used in place of the configuration of inverters 241, 243, and 245, NOR gate 247, bipolar transistor 232, and n-channel transistor 216 for controlling the control signal at node 208.

Other suitable circuitry may also be used for ECL-to-CMOS circuitry 250 illustrated in FIG. 4 in generating control signals, such as control signals pdb 252 and pds 253, in response to an input signal, such as gout 201, goutb 202, and selb 203.

Still other suitable circuitry including similar devices, may be substituted for functionally similar circuitry or similar devices for the embodiments illustrated in the drawings.

Figure 5:
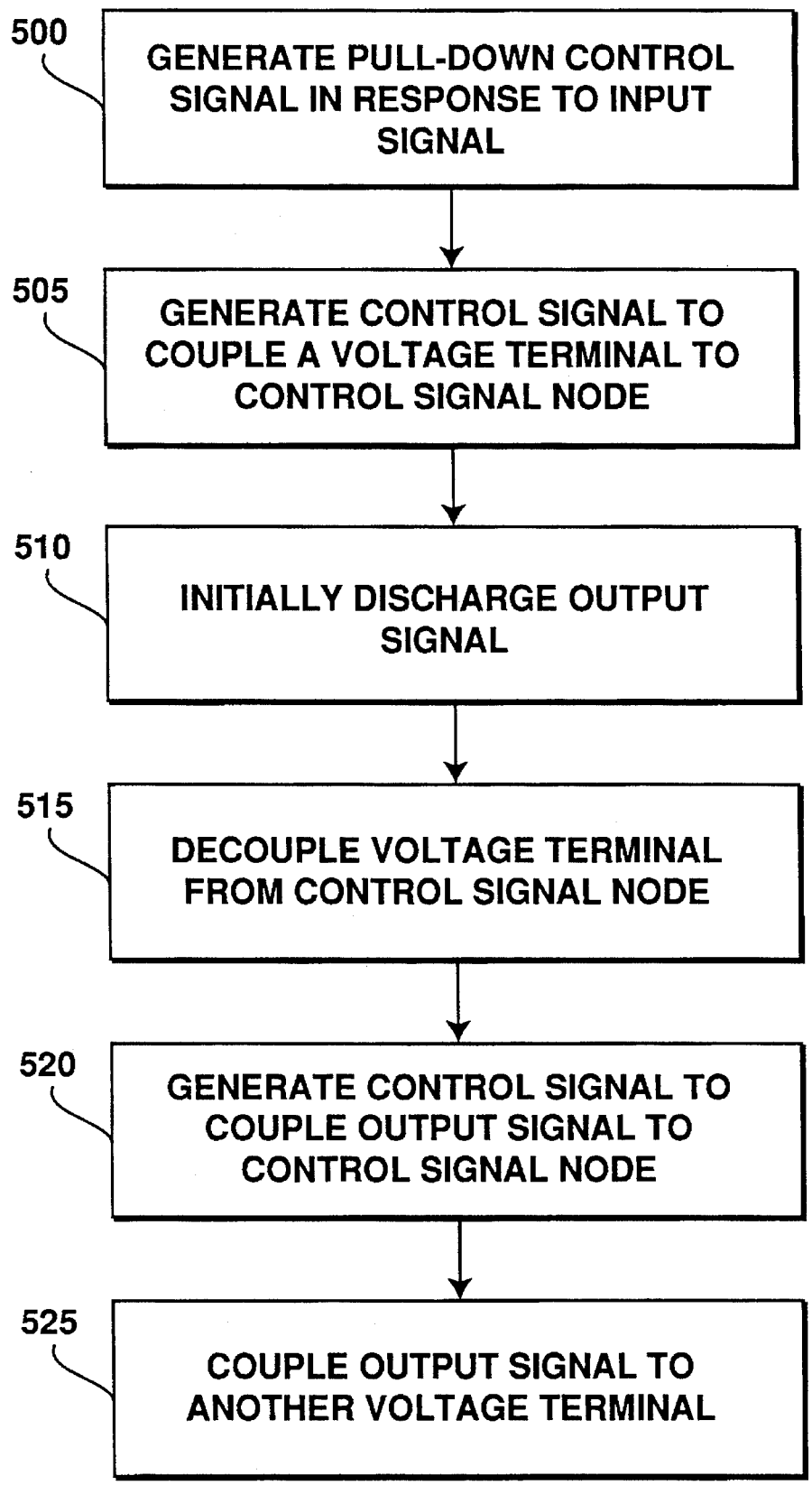
FIG. 5 illustrates, in flow diagram form, a method for controlling the discharge of an output signal.

FIG. 5 illustrates, in flow diagram form, a method for controlling the discharge of an output signal. The steps of FIG. 5 may be performed, for example, using the circuitry illustrated in FIG. 3.

For step 500, a pull-down control signal is generated in response to an input signal. As illustrated in FIG. 3, for example, control signal pdb 252 is generated in response to input signal gout 201.

For step 505, a control signal is generated to couple a voltage terminal to a control signal node. As illustrated in FIG. 3, for example, control signal 248 is generated to couple voltage terminal 233 to control signal node 208. Control signal 248 is outputted from NOR gate 247 in response to the inputting of control signal pdb 252 and control signal 242 into NOR gate 247. Control signal pdb 252 has not yet been inverted by inverter 241 as control signal 242.

For step 510, the output signal is initially discharged. As illustrated in FIG. 3, for example, output signal 205 is initially discharged in response to the coupling of voltage terminal 233 to control signal node 208. Bipolar transistor 230 is turned-on by the control signal at node 208 and couples output signal 205 to voltage terminal 204.

For step 515, the voltage terminal is decoupled from the control signal node. As illustrated in FIG. 3, for example, voltage terminal 233 is decoupled from control signal node 208. Inverter 241 inverts control signal pdb 252 as control signal 242. NOR gate 247 in response generates a control signal 248, shutting off bipolar transistor 232. Voltage terminal 233 is thus decoupled from node 208.

For step 520, a control signal is generated to couple the output signal to the control signal node. As illustrated in FIG. 3, for example, control signal 246 is generated to couple output signal 205 to control signal node 208. Non-inverting delay circuitry, such as inverters 243 and 245, generates control signal 246 in response to control signal 242, the inverted control signal 252 pdb. Control signal 246 turns-on n-channel transistor 216, coupling output signal 205 to node 208.

For step 525, the output signal is coupled to another voltage terminal. As illustrated in FIG. 3, for example, output signal 205 is coupled to voltage terminal 204. The control signal at node 208 turns-on bipolar transistor 230, coupling output signal 205 to voltage terminal 204 and thus further discharging output signal 205. Output signal 205 is pulled-down to voltage terminal 204 by n-channel transistor 212 in response to control signal pds 253.

In the foregoing description, the invention has been described with reference to specific embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for controlling a discharge of an output signal, comprising the steps of:
   (a) receiving an input signal;
   (b) generating a first control signal in response to the input signal;
   (c) generating a second control signal in response to the first control signal;
   (d) initially discharging the output signal in response to the second control signal; and
   (e) controlling the second control signal in response to the first control signal such that the discharge of the output signal is controlled;
   wherein the step of generating the second control signal includes the steps of:
   (i) generating a third control signal in response to the first control signal, including the steps of
      (1) inputting the first control signal and a fourth control signal into a logic gate, and
      (2) outputting the third control signal from the logic gate; and
   (ii) coupling a first voltage terminal to a second control signal node in response to the third control signal to generate the second control signal.

2. A method for controlling a discharge of an output signal, comprising the steps of:
   (a) receiving an input signal;
   (b) generating a first control signal in response to the input signal;
   (c) generating a second control signal in response to the first control signal;
   (d) initially discharging the output signal in response to the second control signal; and
   (e) controlling the second control signal in response to the first control signal such that the discharge of the output signal is controlled;
   wherein the step (c) of generating the second control signal includes the steps of:
   (i) generating a third control signal in response to the first control signal, and
   (ii) coupling a first voltage terminal to a second control signal node in response to the third control signal to generate the second control signal; and
   wherein the step (e) of controlling the second control signal includes the steps of:
   (i) generating a fourth control signal in response to the first control signal, including the steps of:
      (1) inverting the first control signal to generate an inverted control signal, and
      (2) inputting the inverted control signal into a delay to generate the fourth control signal;
   (ii) inputting the fourth control signal into a first transistor, and
   (iii) coupling the output signal to the second control signal node in response to the inputting step (e)(ii).

3. A method for controlling a discharge of an output signal, comprising the steps of:
   (a) receiving an input signal;
   (b) generating a first control signal in response to the input signal;
   (c) generating a second control signal in response to the first control signal;
   (d) initially discharging the output signal in response to the second control signal; and
   (e) controlling the second control signal in response to the first control signal such that the discharge of the output signal is controlled;
   wherein the step (c) of generating the second control signal includes the steps of:
   (i) generating a third control signal in response to the first control signal, and
   (ii) coupling a first voltage terminal to a second control signal node in response to the third control signal to generate the second control signal; and
   wherein the step (e) of controlling the second control signal includes the steps of:
   (i) generating a fourth control signal in response to the first control signal, (ii) inputting the fourth control signal into a first transistor, and (iii) coupling the output signal to the second control signal node in response to the inputting step (e)(ii), (iv) generating a fifth control signal in response to the first control signal, and (v) decoupling the first voltage terminal from the second control signal node in response to the fifth control signal.

4. The method of claim 3, wherein the step (d) of initially discharging the output signal includes the steps of:

(i) inputting the second control signal into a second transistor, and (ii) coupling the output signal to a second voltage terminal in response to the inputting step (d)(i).

5. An electrical apparatus for controlling a discharge of an output signal, comprising:

(a) first circuitry, responsive to an input signal, for generating a first control signal;

(b) second circuitry, coupled to the first circuitry and responsive to the first control signal, for generating a second control signal;

(c) third circuitry coupled to the second circuitry and, responsive to the second control signal, for initially discharging the output signal; and (d) fourth circuitry, coupled to the third circuitry and responsive to the first control signal, for controlling the second control signal such that the discharge of the output signal is controlled;

wherein the second circuitry (b) includes:

(i) fifth circuitry, responsive to the first control signal, for generating a third control signal, and (ii) sixth circuitry, responsive to the third control signal, for coupling a first voltage terminal to a second control signal node to generate the second control signal; and wherein the third circuitry includes a transistor responsive to the second control signal for coupling the output signal to a voltage terminal.

6. The electrical apparatus of claim 5, wherein the fifth circuitry includes a logic gate responsive to the first control signal and to a fourth control signal for outputting the third control signal.

7. The electrical apparatus of claim 5, wherein the third circuitry (c) includes a transistor responsive to the second control signal for coupling the output signal to a second voltage terminal.

8. The electrical apparatus of claim 5, wherein the fourth circuitry (d) includes:

(i) seventh circuitry, responsive to the first control signal, for generating a fourth control signal, and (ii) a first transistor, responsive to the fourth control signal, for coupling the output signal to the second control signal node.

9. The electrical apparatus of claim 8, wherein the seventh circuitry includes:

(1) an inverter responsive to the first control signal for generating an inverted control signal, and (2) a delay responsive to the inverted control signal for generating the fourth control signal.

10. The electrical apparatus of claim 8, wherein the third circuitry (c) includes a second transistor responsive to the second control signal for coupling the output signal to a second voltage terminal.

11. The electrical apparatus of claim 8, wherein the seventh circuitry generates a fifth control signal in response to the first control signal and the transistor decouples the first voltage terminal from the second control signal node in response to the fifth control signal.

12. The electrical apparatus of claim 11, wherein the third circuitry (c) includes a second transistor responsive to the second control signal for coupling the output signal to a second voltage terminal.

* * * * *